United States Patent
Masseth et al.

(10) Patent No.: US 6,799,628 B1
(45) Date of Patent: Oct. 5, 2004

(54) HEAT EXCHANGER HAVING SILICON NITRIDE SUBSTRATE FOR MOUNTING HIGH POWER ELECTRONIC COMPONENTS

(75) Inventors: Robert E. Masseth, Corona, CA (US); Daniel E. Wilson, Wilmington, CA (US); Michael Quan, Torrance, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/620,252

(22) Filed: Jul. 20, 2000

(51) Int. Cl.[7] .............................. F28F 7/00; H05K 7/20
(52) U.S. Cl. .................... 165/80.4; 165/185; 165/905; 361/698
(58) Field of Search ........................... 165/80.4, 185, 165/905, 104.33, 80.2; 361/699, 698; 257/714; 428/469, 209; 501/97.1

(56) References Cited

U.S. PATENT DOCUMENTS

| | | | |
|---|---|---|---|
| 4,298,059 A | * 11/1981 | Krauth et al. | 165/166 |
| 4,461,343 A | * 7/1984 | Token et al. | 165/104.33 |
| 4,574,879 A | 3/1986 | DeGree et al. | |
| 4,608,354 A | * 8/1986 | Avella et al. | 501/97.2 |
| 4,870,036 A | * 9/1989 | Yeh | 501/97.3 |
| 4,938,279 A | * 7/1990 | Betker | 165/46 |
| 5,001,548 A | * 3/1991 | Iversen | 257/714 |
| 5,005,640 A | * 4/1991 | Lapinski et al. | 165/80.4 |
| 5,067,047 A | * 11/1991 | Azar | 165/104.33 |
| 5,159,529 A | * 10/1992 | Lovgren et al. | 165/80.4 |
| 5,315,153 A | * 5/1994 | Nagai et al. | 257/701 |
| 5,463,530 A | 10/1995 | DeGree | |
| 5,473,508 A | * 12/1995 | Porter et al. | 257/695 |
| 5,757,073 A | 5/1998 | Hoffmeyer | |
| 5,912,066 A | * 6/1999 | Takahashi | 428/209 |
| 5,915,463 A | * 6/1999 | Romero et al. | 165/80.3 |
| 5,953,210 A | 9/1999 | Lo | |
| 5,998,000 A | 12/1999 | Ikeda et al. | |
| 6,101,715 A | * 8/2000 | Fuesser et al. | 165/104.33 |
| 6,115,252 A | * 9/2000 | Ohta et al. | 361/699 |
| 6,232,657 B1 | * 5/2001 | Komorita et al. | 257/700 |
| 6,242,374 B1 | * 6/2001 | Komatsu | 501/97.2 |

FOREIGN PATENT DOCUMENTS

| | | |
|---|---|---|
| DE | 19859119 A1 | 7/1999 |
| EP | 09097865 | 4/1997 |
| EP | 0798954 A1 | 10/1997 |
| EP | 0874399 A1 | 10/1998 |

* cited by examiner

*Primary Examiner*—Henry Bennett
*Assistant Examiner*—Tho Van Duong
(74) *Attorney, Agent, or Firm*—Oral Caglar, Esq.

(57) ABSTRACT

A heat exchanger includes a silicon nitride substrate. Electronic components may be surface mounted to the substrate. A fluid passageway in the heat exchanger allows a coolant to flow therethrough and carry away heat from the electronic components.

12 Claims, 2 Drawing Sheets

HEAT EXCHANGER HAVING SILICON NITRIDE SUBSTRATE FOR MOUNTING HIGH POWER ELECTRONIC COMPONENTS

BACKGROUND OF THE INVENTION

The present invention relates to heat exchangers as well as substrates for mounting high power electronic components. More specifically, the present invention relates to dissipation of heat generated by high power electronic components.

High power electronic components such as insulated gate bipolar transistors, diodes, microprocessors and memory chips generate heat during operation. The heat is usually dissipated to prevent damage to these components.

Heat sinks, mounted directly to the electronic components and secured to printed circuit boards, are typically used for dissipating the heat. However, as power densities of these electronic components continue to increase, conventional heat sinks (e.g., heat pipes, aluminum fins) will become impractical for dissipating the heat.

The heat may be dissipated by liquid-cooled heat exchangers. However, typical heat exchanger materials do not possess each of the following characteristics: strength, thermal conductivity, and a coefficient of expansion ("COE") that matches the COE of the electronic components. Heat exchangers possessing these three characteristics are usually made of more than one material. Such heat exchangers are usually complex, heavy and expensive.

SUMMARY OF THE INVENTION

According to one aspect of the present invention, an apparatus comprises a heat exchanger including a silicon nitride substrate; and an electronic component attachment layer on an outer surface of the substrate. According to another aspect of the present invention, an article for mounting high power electronic components comprises a substrate of a silicon nitride having an in-situ reinforced microstructure; and selective metalization on a surface of the substrate.

According to yet another aspect of the present invention, a heat exchanger comprises a frame, and first and second substrates bonded to the frame. The frame and the first and second substrates define a fluid passageway. The first substrate is made of silicon nitride.

DETAILED DESCRIPTION OF THE INVENTION

Figure 1:
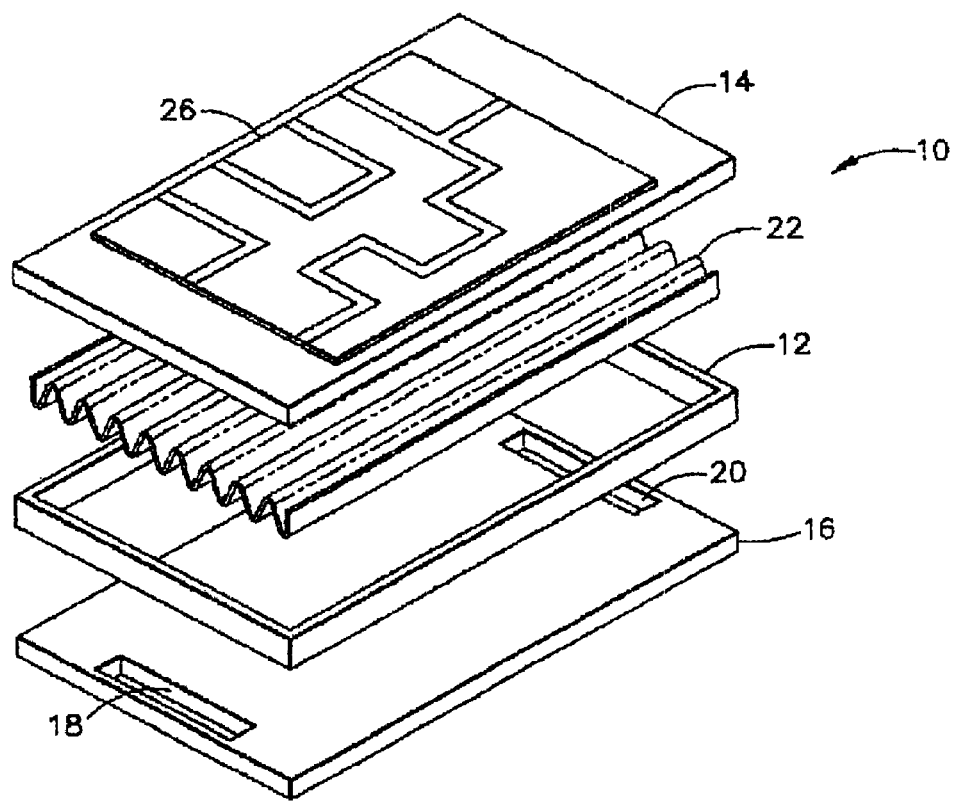
FIG. 1 is an exploded view of an apparatus according to the present invention.
Figure 2:
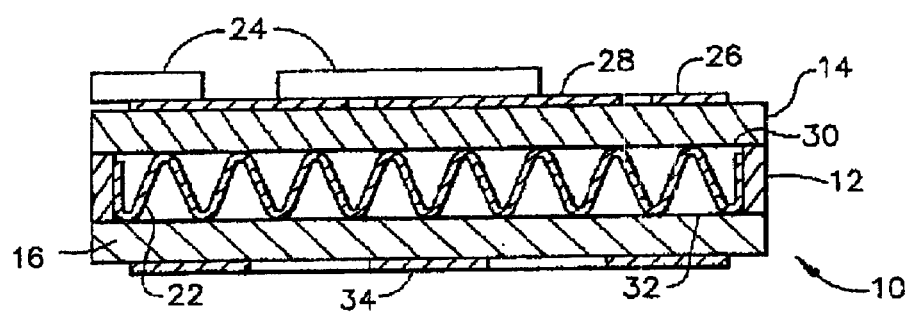
FIG. 2 is a sectional view of the apparatus.

Referring to FIGS. 1 and 2, a heat exchanger 10 includes a frame 12 and first and second substrates 14 and 16 bonded to the frame 12. The substrates 14 and 16 may be bonded to the frame 12 by brazing or another process that creates a leak-proof seal. The frame 12 and the first and second substrates 14 and 16 define a fluid passageway. An inlet 18 and an outlet 20 for the passageway may be formed in the frame 12 or the substrates 14 or 16. The first substrate 14 is made of silicon nitride. The frame 12 and the second substrate 16 also may be made of silicon nitride.

The heat exchanger 10 further includes a heat dissipation element 22 located in the fluid passageway and thermally coupled to the first substrate 14. The heat dissipation element 22 may be a block or sheet made of any material that displays good heat transfer properties (e.g., copper, carbon foam, molybdenum). Corrugating the sheet would increase exposed surface area and improve heat transfer capability. For instance, the heat dissipation element 22 may be a corrugated sheet of copper that is brazed between the first and second substrates 14 and 16.

Selective metalization 26 may be formed on an outer surface of the first substrate 14. The selective metalization may include electrical interconnects and mounting pads for high power electronic components 24. For example, a foil, paste or pre-form of an active metal braze alloy (e.g., a titanium-based alloy, a vanadium-based alloy) may be formed on the outer surface of the first substrate 14 and patterned into mounting pads for the electronic components 24. In certain instances, copper may be built up on the braze alloy to achieve a required current density. Instead, the electrical interconnects and mounting pads may be formed by using a thick film process to apply conductive ink or by sputtering palladium-chrome or nickel-chrome onto the first substrate 14.

The selective metalization 26 may be formed by silk screening an active metal braze alloy paste onto the first substrate 14 in a desired pattern. The first substrate 14 and braze alloy paste are then fired in a vacuum furnace at a temperature that causes melting of the braze alloy and then wetting of the surface of the first substrate 14. The braze alloy paste may contain about ⅔ silver by weight, about ⅓ copper by weight and a trace of titanium.

A protective coating 28 of a nickel-based alloy such as nickel-boron or nickel-phosphorous may be applied atop conductive metals on the outer surface of the first substrate 14. The protective coating 28 prevents oxidation of the conductive metals. The protective coating 28 may have a thickness of about 0.0003" and it may be applied by an electroless plating process. A thin coating of gold may be applied atop the protective coating 28.

Electronic components 24 such as insulated gate bipolar transistors, diodes, microprocessors, memory chips and other heat-producing elements may be surface mounted to the mounting pads of the selective metalization. For example, the components 24 may be brazed or soldered to mounting pads.

During operation, the electronic components 24 generate heat. The heat is transmitted through the attachment layer 26 and first substrate 14, to the heat dissipation element 22. In the meantime, an air or gas coolant is circulated through the fluid passageway (via the inlet 18 and outlet 20). Heat is transferred from the heat dissipation element 22 to the coolant, and the coolant carries away the heat. If a closed cooling circuit is used, the coolant exiting the outlet 20 of the heat exchanger 10 may be cooled (e.g., by another heat exchanger) and returned to the inlet 18 of the heat exchanger 10.

The first substrate 14 is preferably made of "AS800" silicon nitride, which is available from Honeywell International Inc. "AS800" silicon nitride has an in-situ reinforced microstructure that makes it stronger and gives it a higher thermal conductivity than other types of silicon nitride. "AS800" silicon nitride has a thermal conductivity of about 80–90 W/mK, a room temperature flexural strength of about 735 Mpa (four-point bend test), and a fracture toughness of about 8.1 Mpa(m)$^{1/2}$.

These properties allow the first substrate 14 to have a thickness between about 0.010 inches and 0.250 inches and, more preferably, between 0.025 inches and 0.100 inches. Such small thicknesses minimize the thermal impedance of the silicon nitride and allow heat to be transferred from the components 24 to the heat dissipating element 22. If the first substrate 14 is too thick, it will impede the flow of heat to the heat dissipation element 22.

Moreover, "AS800" silicon nitride has a COE (about 3.9 parts per million/inch/° C.) that closely matches the COE of semiconductor silicon. Because there is little thermal mismatch, the electronic components 24 can be surface-mounted directly to the first substrate 14.

The silicon nitride pieces (e.g., the frame 12 and substrates 14 and 16) may be formed by a casting, pressing or molding process. Openings for the inlet 18 and outlet 20 may be laser-machined into the silicon nitride.

The silicon nitride pieces may be brazed together using an active metal braze alloy such as "WESGO TICUSIL." For example, the heat exchanger 10 may be assembled by placing a first sheet of "TICUSIL" foil 30 (or screenable paste) on the first substrate 14, the frame 12 and the heat dissipation element 22 on the first sheet 30 of foil, a second sheet 32 of "TICUSIL" foil on the frame 12 and heat dissipation element 22, the second substrate 16 on the second sheet 32 of foil, and brazing the entire assembly together.

After the heat exchanger 10 has been assembled, an end user can surface-mount electronic components 24 to the metalization 26 on the first substrate 14. The heat exchanger 10 may be clamped to a structure and coolant piping.

Geometries and areas of the substrates 14 and 16, as well as distances between the substrates 14 and 16, are application-specific. For example, the substrates 14 and 16 may have a rectangular geometry.

Selective metalization 34 may also be formed on the second substrate 16, and electronic components 24 may be mounted it. This would allow electronic components 24 to be mounted to both substrates 14 and 16 of the heat exchanger 10.

The fluid passageway of the heat exchanger 10 may be divided into multiple channels by the heat dissipation element 22. For example, a fin-shaped heat dissipation element extending between the first and second substrates 14 and 16 would create multiple channels.

The heat exchanger 10 can function without a heat dissipation element 22. However, the heat dissipation element 22 enhances heat transfer.

Figure 3:
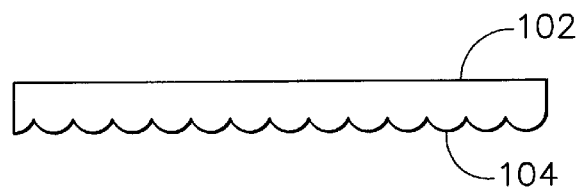
FIG. 3 is a sectional view of an alternative silicon nitride substrate for the apparatus.

The heat exchanger 10 is not limited to a heat dissipation element 22 that is brazed between the first and second substrates 14 and 16. An alternative heat dissipation element may be integrally formed with one or both of the substrates. For example, a fin-shaped pattern 104 may be stamped into the inner surface of the first substrate 102 (see FIG. 3).

Yet another heat dissipation element could be implemented by metalizing the inner surface of the first substrate 14 with a metal braze alloy (e.g., "WESGO TICUSIL" braze alloy). The first and second substrates 14 and 16 would be bonded to the frame 12 by using a lower temperature braze alloy (e.g., "WESGO CUSILTIN-10 foil).

The heat exchanger is not limited to substrates and a frame that are formed separately. For example, one of the substrates may be formed integrally with the frame.

The heat exchanger is not limited to a frame and second substrate made of silicon nitride. For example, the first substrate may be bonded to a heat exchanger core made of a metal such as molybdenum. However, the silicon nitride frame and silicon nitride substrates provide a more robust design because thermal coefficients are well-matched.

Figure 4:
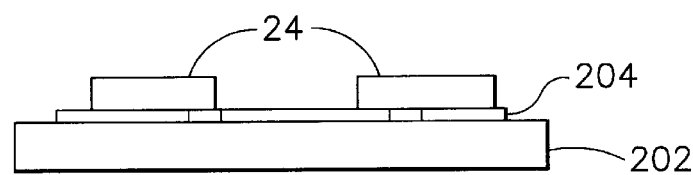
FIG. 4 is a sectional view of an alternative electronic component attachment layer for the apparatus.
Figure 5:
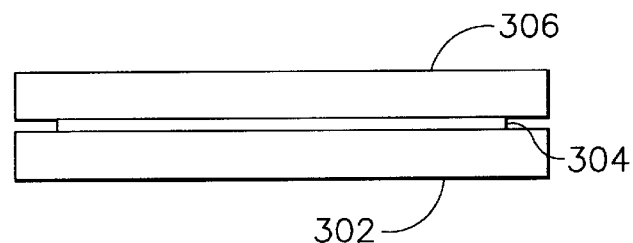
FIG. 5 is a sectional view of two silicon nitride substrates and an alternative electronic component attachment layer therebetween.

An electronic component attachment layer other than selective metalization may be formed on the substrate(s). For example, the electronic component attachment layer may be an adhesive 204 that secures the components 24 directly to the substrate 202 (see FIG. 4) or a solid metal sheet 304 that allows the substrate 302 to be bonded to another substrate 306 (see FIG. 5).

Figure 6:
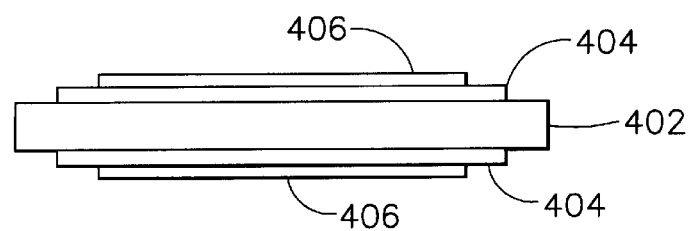
FIG. 6 is a sectional view of a silicon nitride substrate and alternative electronic component attachment layers.

The electronic component attachment layer may even include a polyamide board 404 having a first surface bonded (for example, by an adhesive) to a silicon nitride substrate 402 and a second surface that carries selective metalization 406 (see FIG. 6). Such a combination has better thermal conductivity than conventional copper-molybdenum-copper boards. Polyamide boards 404 may even be bonded to both sides of the silicon nitride substrate 402.

The type of silicon nitride is not limited to "AS800". For example, "GS-44" silicon nitride may be used. "GS-44" silicon nitride, which is also available from Honeywell International Inc., generally has higher strength but lower thermal conductivity than "AS800" silicon nitride.

Multiple heat exchangers 10 may be arranged in an array to form a larger substrate. Electrical interconnections would be used to connect the selective metalizations of different heat exchangers 10.

Although the present invention has been described above with reference to specific embodiments, it is not so limited. Instead, the present invention is construed according to the claims that follow.

What is claimed is:

1. Apparatus comprising a heat exchanger including a first substrate, a hollow frame and a second substrate, the first and second substrates bonded to opposite sides of the hollow frame, the frame and the substrates forming an enclosure for a fluid passageway, wherein the first substrate is made of silicon nitride having a thermal conductivity of about 80–90 W/mK, a room temperature four-point bend test flexural strength of about 735 Mpa, and a fracture toughness of about 8.1 Mpa(m)$^{1/2}$.

2. The apparatus of claim 1, wherein the frame and the second substrate are also made of silicon nitride.

3. The apparatus of claim 1, wherein the first substrate has a thickness between about 0.025 inches and 0.100 inches.

4. The apparatus of claim 1, further comprising an electronic component attachment layer including a sheet of a conductive metal on a surface of the first substrate.

5. The apparatus of claim 4, wherein the electronic component attachment layer includes an adhesive.

6. The apparatus of claim 1, further comprising an electronic component attachment layer on the first substrate, the attachment layer including a polyamide board having selective metalization.

7. The heat exchanger of claim 1, further comprising a heat dissipation element integral with one of the substrates.

8. A heat exchanger comprising:
a hollow, unitary frame made of silicon nitride;

first and second substrates bonded to opposite sides of the hollow, unitary frame, the frame and the first and second substrates defining an enclosure for a fluid passageway, the first and second substrates made of silicon nitride; and an electronic component attachment layer on a surface of the first substrate.

9. The heat exchanger of claim 8, wherein the electronic component attachment layer includes selective metalization made of a conductive metal.

10. The heat exchanger of claim 8, wherein the electronic component attachment layer includes a polyamide board having selective metalization.

11. The apparatus of claim 8, wherein the heat exchanger further includes a heat dissipation element within the fluid passageway.

12. The apparatus of claim 11, wherein the heat dissipation element is integral with the first substrate.

* * * * *